(12) United States Patent
Kikuchi et al.

(10) Patent No.: US 6,603,888 B1
(45) Date of Patent: Aug. 5, 2003

(54) INTERPOLATING APPARATUS AND METHOD

(75) Inventors: Atsushi Kikuchi, Kanagawa (JP); Koji Aoyama, Saitama (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/413,880

(22) Filed: Oct. 7, 1999

(30) Foreign Application Priority Data

Oct. 13, 1998 (JP) .......................................... 10-290613

(51) Int. Cl.[7] .................................................. G06K 9/32
(52) U.S. Cl. ...................................... 382/300; 358/525
(58) Field of Search ................................ 382/300, 299, 382/298, 293; 345/606, 609, 660, 667; 358/525

(56) References Cited

U.S. PATENT DOCUMENTS 5,671,298 A * 9/1997 Markandey et al. ........ 382/298
5,809,182 A * 9/1998 Ward et al. ................. 382/298
6,075,926 A * 6/2000 Atkins et al. ............... 395/102
6,088,062 A * 7/2000 Kanou et al. ............... 348/441
6,356,315 B1 * 3/2002 Chen et al. ................. 348/581

* cited by examiner

Primary Examiner—Yon J. Couso
(74) Attorney, Agent, or Firm—Rader, Fishman & Grauer PLLC; Ronald P. Kananen

(57) ABSTRACT

In multiplying circuits, filter coefficients are multiplied to tap outputs between the stages of delay circuits, respectively. The multiplication outputs are added by an adding circuit, thereby performing an interpolation arithmetic operation. Phase information and coefficient adjustment data are inputted to a coefficient generating circuit. Either the nearest neighborhood approximating method or the bilinear approximating method can be selected by the coefficient adjustment data, and any of the intermediate characteristics between the nearest neighborhood approximating method and the bilinear approximating method, characteristics which are closer to those of the nearest neighborhood approximating method between the nearest neighborhood approximating method and the bilinear approximating method, and characteristics which are closer to those of the bilinear approximating method can be freely set.

5 Claims, 5 Drawing Sheets

PERIOD T

PERIOD 3/8T

INTERPOLATING APPARATUS AND METHOD

BACKGROUND OF THE INVENTION

1. Field of the Invention

The invention relates to interpolation arithmetic operating apparatus and method which are suitable for use in enlargement and reduction of an image, conversion of a sampling frequency, or conversion of the number of lines.

2. Description of the Related Art

The NTSC (National Television System Committee) system and PAL (Phase Alternation by Line) system have been known as systems of a standard television broadcasting signal. According to the NTSC system, the number of scanning lines of one frame is equal to 525. According to the PAL system, the number of scanning lines of one frame is equal to 625. The numbers of scanning lines in the NTSC system and the PAL system are different.

Not only the standard system such as NTSC system or PAL system, the development of a television broadcasting of the HDTV (High Definition Television) system has been progressed in recent years. In the HDTV system, the number of scanning lines of one frame is set to 1125.

Further, in a computer image, a video signal of a format different from that of the television broadcasting is used, the number of pixels of VGA (Video Graphics Array) is equal to (640×480) dots, and the number of pixels of SVGA (Super VGA) is equal to (800×600) dots.

In case of performing the system conversion among the video signals of a plurality of systems in which the numbers of pixels in the horizontal direction are different and the numbers of scanning lines are different, an interpolation arithmetic operation is performed. In case of enlarging and reducing an image, the conversion of the numbers of pixels in the horizontal direction and the vertical direction is executed. An interpolation arithmetic operation is also performed in this instance.

The interpolation arithmetic operation intends to obtain a value of pixel data at a position where it does not exist in an original image by using peripheral pixel data.

For example, as shown in FIG. 1, it is now assumed that original pixels Ra, Rb, Rc, and Rd are arranged in the horizontal direction at a sampling interval S. It is assumed that pixel data at a position Q shown by an arrow is formed by an interpolation.

Since there is a correlation among the neighboring pixel data arranged in the horizontal direction, the pixel data at the position Q can be obtained from the pixel data of the pixels Ra, Rb, Rc, and Rd arranged at peripheral positions. That is, now assuming that filter coefficients are Ha, Hb, Hc, and Hd, the pixel data at the position Q can be obtained by the following convolution arithmetic operation.

$$Q = Ha \times Ra + Hb \times Rb + Hc \times Rc + Hd \times Rd$$

Hitherto, a nearest neighborhood approximating method, a bilinear approximating method, or the like has been known as an approximating method of the interpolation arithmetic operation. According to the nearest neighborhood approximating method, the interpolation is performed by using the nearest neighboring pixel data. That is, in the nearest neighborhood approximating method, when $(-0.5 < x \leq 0.5)$, $$f(x)=1$$

and when $(-0.5 \geq x, x > 0.5)$, $$f(x)=0$$

According to the nearest neighborhood approximating method, since the interpolation is performed by replacing the nearest neighboring pixel data, its process is simple. However, precision of the interpolation is low.

According to the bilinear approximating method, the interpolation data is obtained by using the weighted mean of two neighboring pixels. That is, in the bilinear approximating method, when $(|x| \leq 1)$, $$f(x)=1-|x|$$

When $(|x|>1)$, $$f(x)=0$$

According to the bilinear approximating method, since an arithmetic operation of two taps is performed, a circuit scale is relatively small. As for a set of the filter coefficients, if two filter coefficients are added, an addition result is equal to "1". Therefore, the coefficients can be relatively easily obtained.

That is, now assuming that a phase is labelled as p, the filter coefficients are obtained by "$x_1=p, x_2=1-p$". When the phase p is equal to (p=0), the coefficient set is equal to (1, 0). When the phase p is equal to (p=0.5), the coefficient set is equal to (0.5, 0.5). When the phase p is equal to (p=0.3), the coefficient set is equal to (0.7, 0.3). Therefore, the filter coefficients can be obtained in a real-time manner.

However, according to the bilinear approximating method, although the interpolation precision is improved as compared with that by the nearest neighborhood approximating method, a picture plane is seen as if it blurred. It is difficult to obtain a high picture quality.

FIG. 2 shows a construction of a conventional interpolating circuit in case of performing the interpolation arithmetic operation by the bilinear approximating method.

In FIG. 2, reference numerals 102 and 103 denote delay circuits. The delay circuits 102 and 103 are cascade connected. Each of the delay circuits 102 and 103 has a delay amount of one sample. A shift register is constructed by the delay circuits 102 and 103.

Digital video data is supplied from an input terminal 101 to the cascade connection of the delay circuits 102 and 103. A clock is supplied from a clock input terminal 107 to the delay circuits 102 and 103. The digital video data from the input terminal 101 is transferred by the clock. Thus, pixel data of two continuous samples is obtained between the stages of the delay circuits 102 and 103. Outputs of the delay circuits 102 and 103 are supplied to multiplying circuits 104 and 105, respectively. Filter coefficients are supplied from a coefficient generating circuit 106 to the multiplying circuits 104 and 105.

Phase information is supplied from an input terminal 108 to the coefficient generating circuit 106.

The coefficient generating circuit 106 generates filter coefficients h1(p) and h2(p) according to the phase information. The filter coefficients h1(p) and h2(p) are used to generate the coefficients to perform the interpolation arithmetic operation by the bilinear approximating method. The filter coefficients h1(p) and h2(p) are supplied to the multiplying circuits 104 and 105.

In the multiplying circuits 104 and 105, each pixel data from the portion between the stages of the delay circuits 102 and 103 is multiplied by the filter coefficients h1(p) and h2(p) from the coefficient generating circuit 106, respectively. Outputs of the multiplying circuits 104 and 105 are supplied to an adding circuit 109. An output of the adding circuit 109 is taken out from an output terminal 110.

The above construction of an actual interpolation arithmetic operating circuit can be realized by hardware as it is or a procedure of such a circuit can be realized in a software manner by a software program installing a processor.

By performing the interpolation by the nearest neighborhood approximating method or bilinear approximating method as mentioned above, the interpolation arithmetic operation of an arbitrary ratio can be performed and, according to the interpolation by the nearest neighborhood approximating method, since the interpolation is performed by replacing the nearest neighboring pixel data, a sharp interpolation image is obtained. However, there are problems such that thicknesses of lines of characters are not uniform, an oblique line shaggy portion is conspicuous, and the like. On the other hand, according to the interpolation by the bilinear approximating method, a situation such that the thicknesses of lines of characters are not uniform or a shaggy portion is conspicuous or the like does not occur. However, if the interpolation is performed by the bilinear approximating method, a high band component of a picture plane is insufficient, the picture plane which is blurred as a whole is obtained, and it is difficult to obtain a high picture quality.

As mentioned above, each of the nearest neighborhood approximating method and bilinear approximating method has merits and demerits and which one of them is the optimum changes depending on characteristics of a picture plane to be displayed or a taste or a demand of the user. There is also a case where intermediate characteristics between the nearest neighborhood approximating method and the bilinear approximating method are required. For this purpose, an interpolation arithmetic operating method such as to have the intermediate characteristics between the nearest neighborhood approximating method and the bilinear approximating method is required.

Hitherto, the interpolating method has been fixed to either the nearest neighborhood approximating method or the bilinear approximating method. However, which one of them is the optimum changes depending on characteristics of a picture plane to be displayed or a taste or a demand of the user as mentioned above. Therefore, it is desired that the nearest neighborhood approximating method and the bilinear approximating method can be freely selected and it is possible to freely set any of the intermediate characteristics between the nearest neighborhood approximating method and the bilinear approximating method, characteristics which are closer to those of the nearest neighborhood approximating method between the nearest neighborhood approximating method and the bilinear approximating method, and characteristics which are closer to those of the bilinear approximating method.

OBJECTS AND SUMMARY OF THE INVENTION

It is an object of the invention to provide interpolation arithmetic operating apparatus and method which can fetch characteristics of the nearest neighborhood approximating method and characteristics of the bilinear approximating method at an arbitrary ratio and can perform an interpolation arithmetic operation.

According to the invention, there is provided an interpolation arithmetic operating apparatus for performing an interpolation by a convolution arithmetic operation by multiplying outputs of first and second taps by first and second filter coefficients, comprising:

cascade connected delay means for extracting the outputs of the first and second taps;

first and second multiplying means for multiplying the outputs of the first and second taps which are outputted from the delay means by the first and second filter coefficients, respectively;

adding means for adding outputs of the first and second multiplying means; and coefficient generating means for generating the first and second filter coefficients in accordance with phase information and coefficient adjustment data, wherein an interpolation arithmetic operation output is obtained from the adding means.

According to the invention, the first and second filter coefficient generating means can generate filter coefficients of characteristics of a nearest neighborhood approximating method to perform the interpolation by replacing nearest neighboring pixel data and filter coefficients of characteristics of a bilinear approximating method to obtain interpolation data by using a weighted mean of neighboring pixels and can generate filter coefficients of intermediate characteristics between the nearest neighborhood approximating method and the bilinear approximating method, and a ratio of the characteristics of the nearest neighborhood approximating method and a ratio of the characteristics of the bilinear approximating method can be set in accordance with the coefficient adjustment data.

According to the invention, when the coefficient generating means obtains the first filter coefficient $h1(p)$, it subsequently obtains the second filter coefficient $h2(p)$ by an arithmetic operation of $$h2(p)=1-h1(p)$$

Coefficient adjustment data $\alpha$ is inputted to a coefficient generating circuit. By the coefficient adjustment data $\alpha$, either the nearest neighborhood approximating method or the bilinear approximating method can be selected and any of the intermediate characteristics between the nearest neighborhood approximating method and the bilinear approximating method, the characteristics which are closer to those of the nearest neighborhood approximating method between the nearest neighborhood approximating method and the bilinear approximating method, and the characteristics which are closer to those of the bilinear approximating method can be freely set.

The above and other objects and features of the present invention will become apparent from the following detailed description and the appended claims with reference to the accompanying drawings.

DETAILED DESCRIPTION OF THE PREFERRED EMBODIMENT

Figure 1:
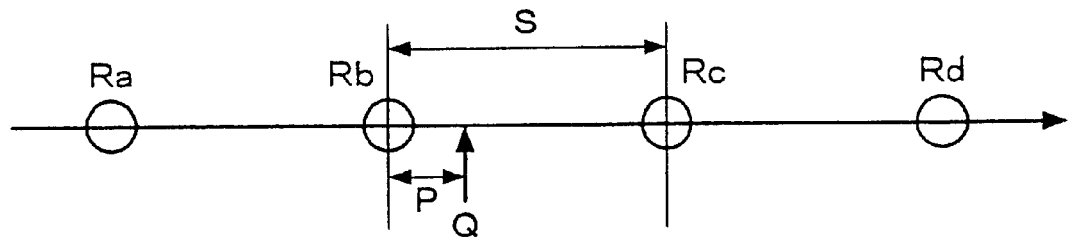
FIG. 1 is a schematic diagram for use in explanation of an interpolation arithmetic operation.
Figure 2:
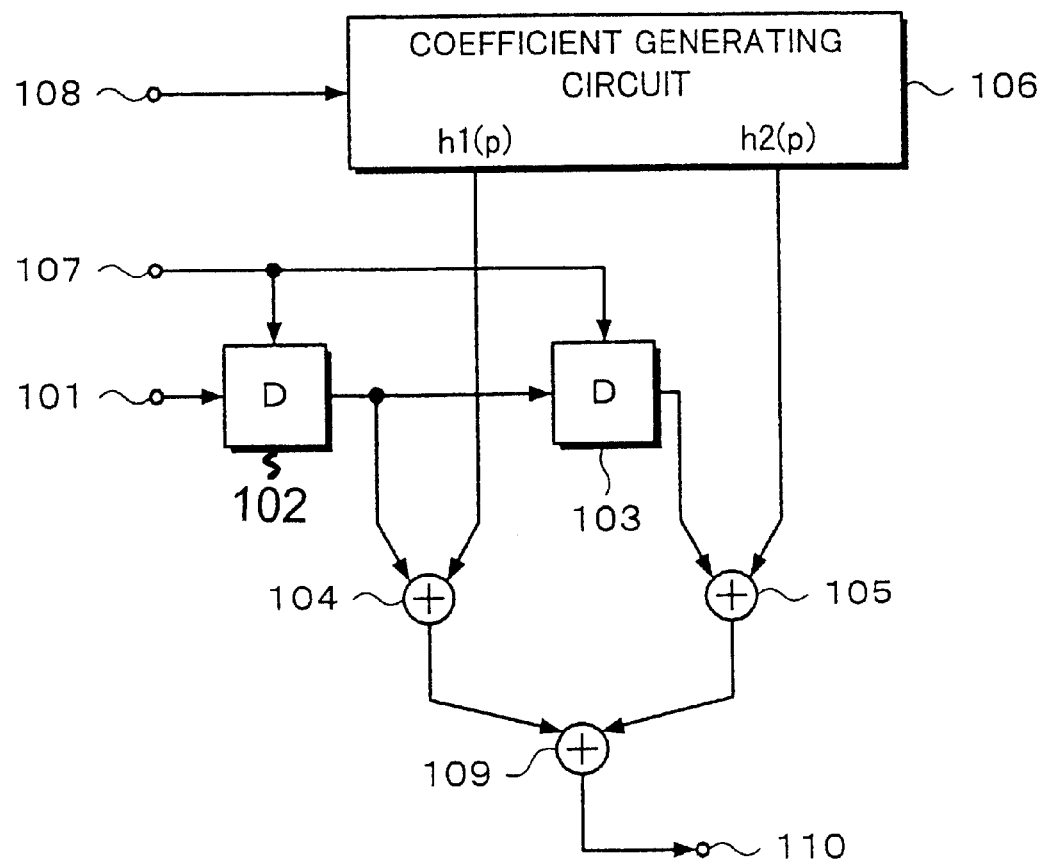
FIG. 2 is a block diagram of an example of a conventional interpolation arithmetic operating apparatus.
Figure 3:
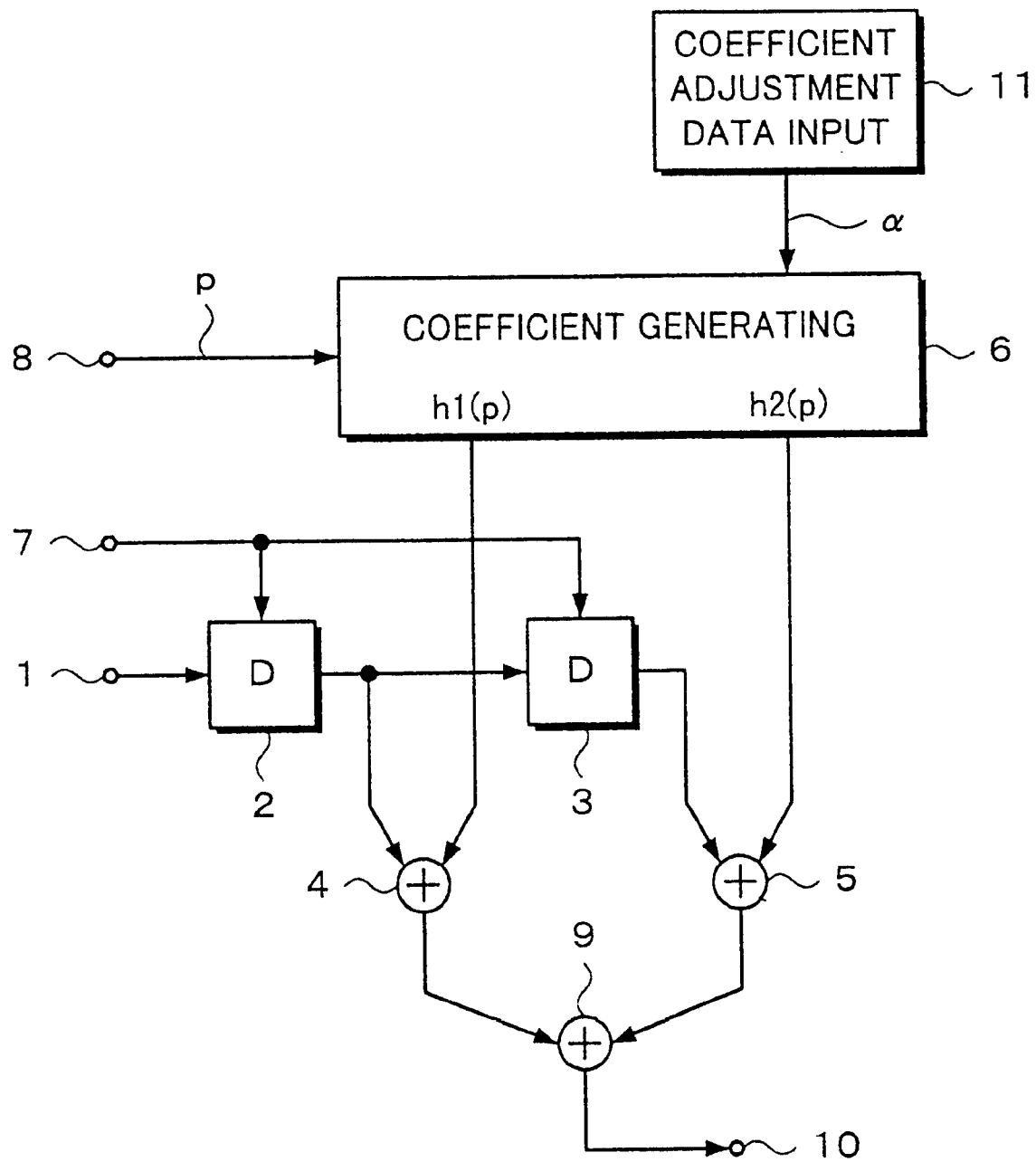
FIG. 3 is a block diagram of an example of an interpolation arithmetic operating apparatus to which the invention is applied.

An embodiment of the invention will now be described hereinbelow with reference to the drawings. FIG. 3 shows an example of an interpolating circuit to which the invention is applied. In FIG. 3, reference numeral 1 denotes an input terminal. Digital video data is supplied to the input terminal 1. The digital video data is supplied to a cascade connection of delay circuits 2 and 3. Each of the delay circuits 2 and 3 performs a delay of one sample. A clock is supplied from a terminal 7 to the delay circuits 2 and 3. The video data from the input terminal 1 is delayed by the delay circuits 2 and 3. Pixel data of two continuous samples is obtained from each of the delay circuits 2 and 3.

An output of the delay circuit 2 is supplied to a multiplying circuit 4. An output of the delay circuit 3 is supplied to a multiplying circuit 5. Filter coefficients h1(p) and h2(p) are supplied from a coefficient generating circuit 6 to the multiplying circuits 4 and 5, respectively.

The phase information p is supplied from a terminal 8 to the coefficient generating circuit 6. Coefficient adjustment data α is supplied from a coefficient adjustment data input unit 11 to the coefficient generating circuit 6. The coefficient generating circuit 6 generates the coefficients h1(p) and h2(p) for the multiplying circuits 4 and 5 on the basis of the phase information p and coefficient adjustment data α, respectively.

The coefficients h1(p) and h2(p) are obtained by using the nearest neighborhood approximating method for performing the interpolation by replacing the nearest neighboring pixel data or the bilinear approximating method for obtaining interpolation data by using the weighted mean of neighboring pixels. Since the nearest neighborhood approximating method performs the interpolation by replacing the nearest neighboring pixel data, a sharp interpolation image is obtained. However, there are problems such that thicknesses of lines of characters are not uniform, a shaggy portion or the like is conspicuous, and the like. On the other hand, according to the interpolation by the bilinear approximating method, a situation such that the thicknesses of lines of characters are not uniform or a shaggy portion or the like is conspicuous does not occur. However, if the picture plane which is blurred as a whole is obtained. As mentioned above, each of the nearest neighborhood approximating method and bilinear approximating method has merits and demerits and which one of them is the optimum changes depending on characteristics of a picture plane to be displayed or a taste or a demand of the user. There is also a case where intermediate characteristics between the nearest neighborhood approximating method and the bilinear approximating method are required.

For this purpose, in the embodiment of the invention, the coefficient adjustment data input unit 11 is provided and the coefficient adjustment data α is supplied from the coefficient adjustment data input unit 11. Either the nearest neighborhood approximating method or the bilinear approximating method can be selected by the coefficient adjustment data α and any of the intermediate characteristics between the nearest neighborhood approximating method and the bilinear approximating method, the characteristics which are closer to those of the nearest neighborhood approximating method between the nearest neighborhood approximating method and the bilinear approximating method, and the characteristics which are closer to those of the bilinear approximating method can be freely set.

The coefficients obtained by the coefficient generating circuit 6 are supplied to the multiplying circuits 4 and 5. In the multiplying circuits 4 and 5, the coefficients from the coefficient generating circuit 6 are multiplied to the outputs of the delay circuits 2 and 3. Outputs of the multiplying circuits 4 and 5 are supplied to an adding circuit 9. The outputs of the multiplying circuits 4 and 5 are added by the adding circuit 9. An output of the adding circuit 9 is generated from an output terminal 10.

By such an interpolating circuit, an interpolating process in case of performing a system conversion among video signals of a plurality of systems in which the numbers of pixels in the horizontal direction are different and the numbers of scanning lines are different or an interpolating process when an image is enlarged or reduced is performed.

The coefficient generating circuit 6 will now be described. The interpolating circuit to which the invention is applied generates the coefficients h1(p) and h2(p) on the basis of a prototype filter having an impulse response as shown in FIG. 4.

Figure 4:
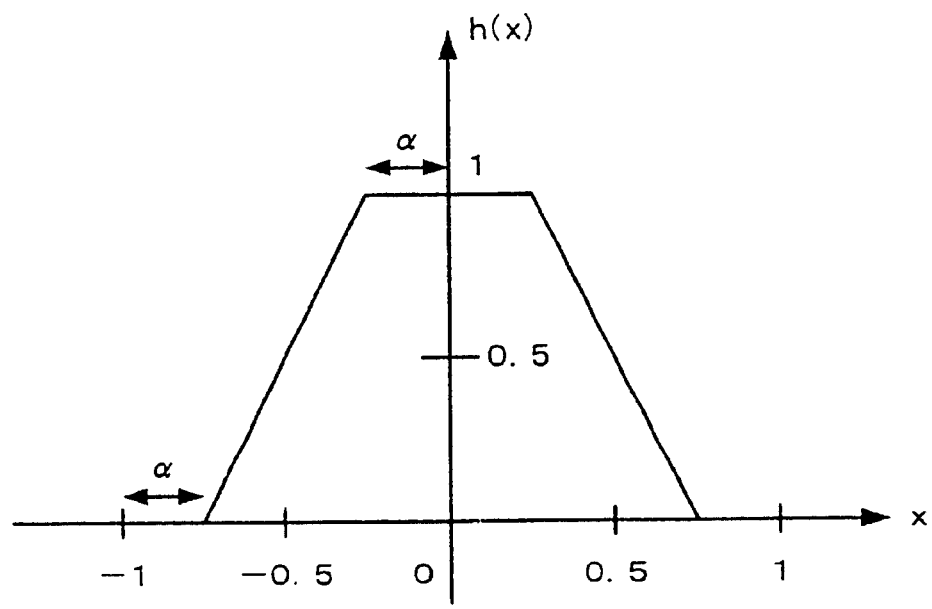
FIG. 4 is a graph for use in explanation of an example of the interpolation arithmetic operating apparatus to which the invention is applied.

That is, in FIG. 4, an axis of abscissa denotes a value of x and an axis of ordinate indicates a value of h(x). In the filter of the impulse response as shown in FIG. 4, when $|x|$ lies within 0 and α, h(x) is equal to 1. When $|x|$ exceeds α, h(x) linearly changes. Therefore, characteristics as shown in FIG. 4 can be expressed by the following equations.

When $0 \leq |x| < \alpha$, $h(x)=1.$

When $\alpha \leq |x| < 1-\alpha$, $h(x)=(1-\alpha-x)/(1-2\alpha).$

When $1-\alpha \leq |x|$, $h(x)=0.$

Figure 5:
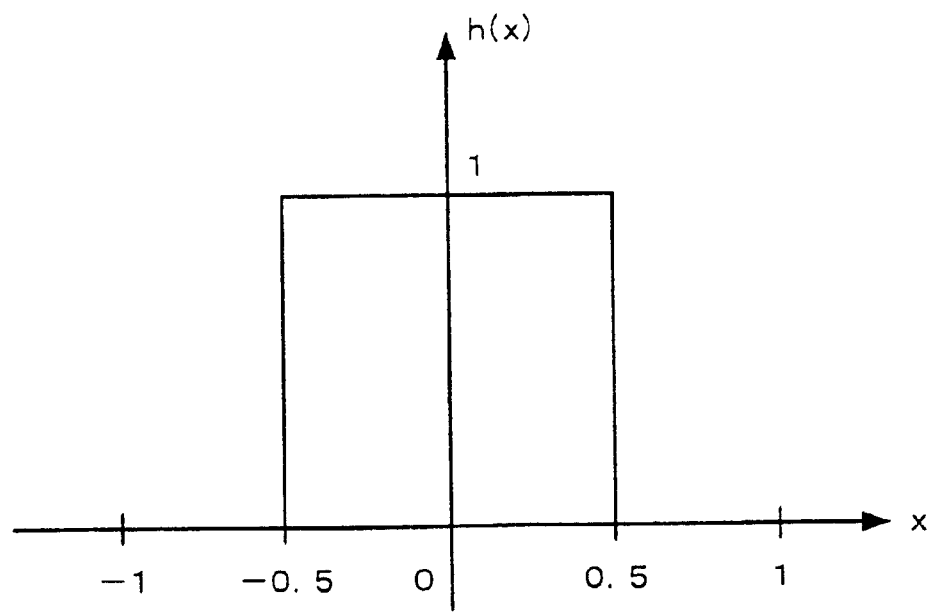
FIG. 5 is a graph for use in explanation of an example of the interpolation arithmetic operating apparatus to which the invention is applied.

From the above equations, now assuming that (α=0.5), characteristics as shown in FIG. 5 are obtained. These characteristics are characteristics such that the interpolation is performed by replacing the pixels by neighboring pixels and are substantially the same as those in the nearest approximation.

Figure 6:
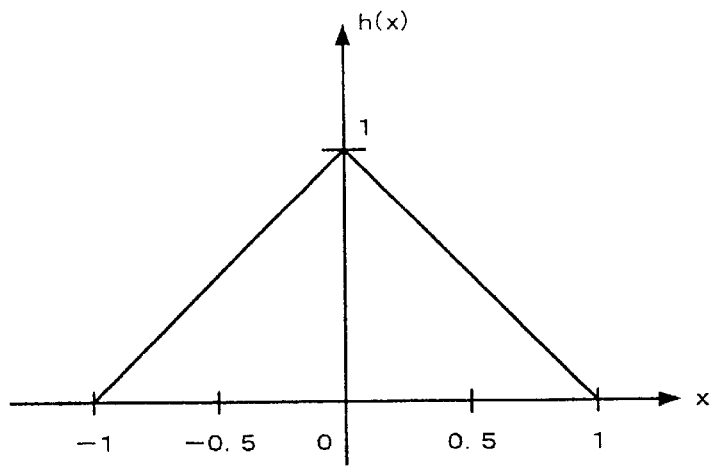
FIG. 6 is a graph for use in explanation of an example of the interpolation arithmetic operating apparatus to which the invention is applied.

When (α=0), characteristics as shown in FIG. 6 are obtained. These characteristics are characteristics such that the interpolation data is obtained by using the weighted mean of the neighboring pixels and are substantially the same as those in the bilinear approximation.

As mentioned above, in the above equations, by changing the value of α, the characteristics which are close to those in the nearest approximation or the characteristics which are close to those in the bilinear approximation can be obtained. In the coefficient generating circuit 6 shown in FIG. 3, the value of α can be freely set within a range of $(0 \leq \alpha < 0.5)$ by the adjustment data which is inputted to the coefficient adjustment data input unit 11. Thus, either the nearest neighborhood approximating method or the bilinear approximating method can be selected and any of the intermediate characteristics between the nearest neighborhood approximating method and the bilinear approximating method, the characteristics which are closer to those of the nearest neighborhood approximating method between the nearest neighborhood approximating method and the bilinear approximating method, and the characteristics which are closer to those of the bilinear approximating method between the nearest neighborhood approximating method and the bilinear approximating method can be freely set.

Since the approximation equation is limited to a range of (−1<x<1), if this approximation equation is used as an interpolation function, an interpolation arithmetic operation can be performed by an FIR filter of two taps in a manner similar to the bilinear approximating method.

In this example, as shown in FIGS. 4 to 6, the characteristics are point-symmetrical at a position "0.5". That is, assuming that the first filter coefficient is labelled to h1(p) and the second filter coefficient is labelled to h2(p) (p denotes the phase information), there is the following relation.

$$h2(p)=1-h1(p)$$

Therefore, if one filter coefficient is obtained, the other filter coefficient can be obtained by a subtraction, so that a real-time process can be performed.

Figure 7:
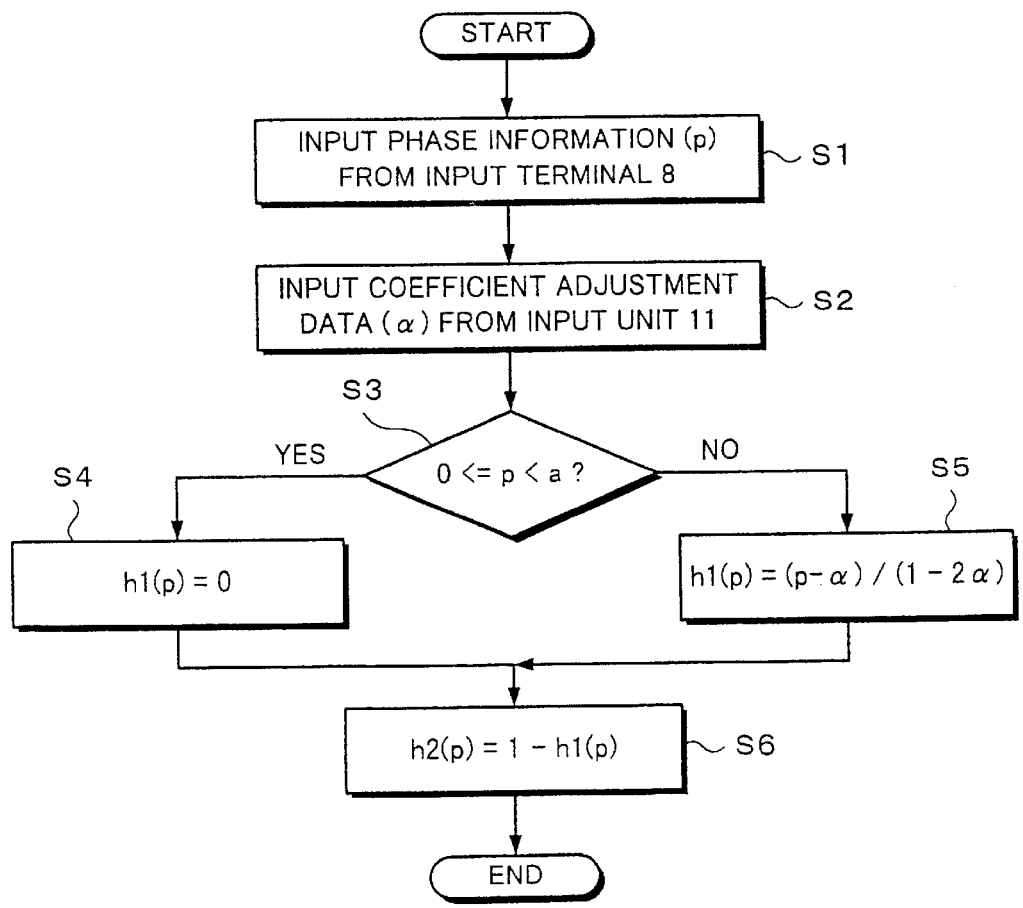
FIG. 7 is a flowchart for use in explanation of an example of the interpolation arithmetic operating apparatus to which the invention is applied.

That is, the two filter coefficients h1(p) and h2(p) can be obtained as shown in a flowchart in FIG. 7.

In FIG. 7, the phase information p is inputted to the input terminal 8 (step S1). The coefficient adjustment data α is inputted to the coefficient adjustment data input unit 11 (step S2).

Whether the phase p satisfies the relation (0≦p<α) or not is discriminated (step S3). If the phase p satisfies the relation (0≦p<α), the coefficient h1(p) is set to $$h1(p)=0$$

(step S4). The processing routine advances to step S6.

If the phase p does not satisfy the relation (0≦p<α), the coefficient h1(p) is set to $$h1(p)=(p-\alpha)/(1-2\alpha)$$

(step S5). The processing routine advances to step S6.

If one filter coefficient is obtained, the other filter coefficient can be obtained by subtracting the other filter coefficient from 1, so that the other filter coefficient h2(p) is obtained by $$h2(p)=1-h1(p)$$

According to the embodiment of the invention as mentioned above, either the nearest neighborhood approximating method or the bilinear approximating method can be selected by the coefficient adjustment data α, and any of the intermediate characteristics between the nearest neighborhood approximating method and the bilinear approximating method, characteristics which are closer to those of the nearest neighborhood approximating method between the nearest neighborhood approximating method and the bilinear approximating method, and characteristics which are closer to those of the bilinear approximating method can be freely set. How the data changes when the interpolation arithmetic operation is performed by each of the interpolating methods will now be described with reference to FIGS. 8A to 8D.

Figure 8A:
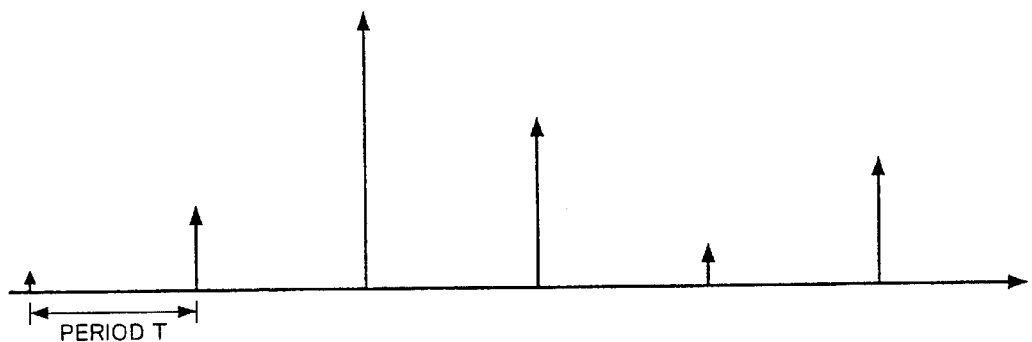
FIGS. 8A to 8D are schematic diagrams for use in explanation of an example of the interpolation arithmetic operating apparatus to which the invention is applied.

FIG. 8A shows sampling data of an image of an original signal. The sampling data of an image of an original signal is sampled at a sampling period T.

Figure 8B:
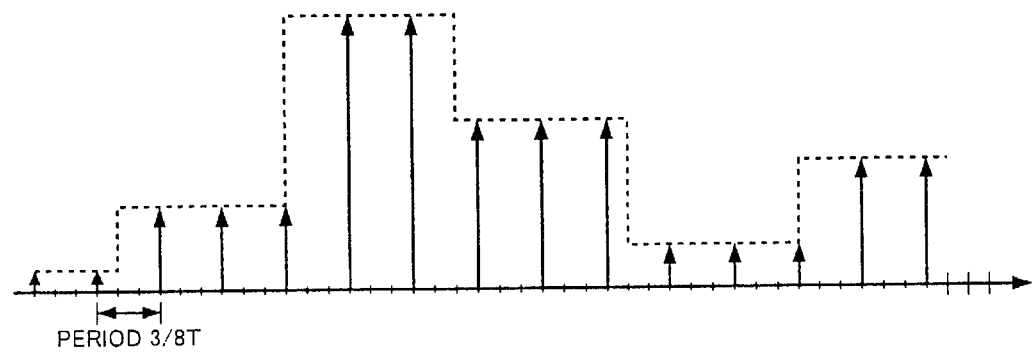

FIG. 8B shows an example in which the original signal is enlarged and interpolated to 8/3 times by the nearest neighborhood approximating method. When it is enlarged and interpolated to 8/3 times, the sampling period is set to (3/8)T. In this instance, according to the nearest neighborhood approximating method, since the data is replaced by the nearest neighboring data, a boundary becomes clear as shown in FIG. 8B. However, in the image signal, although it is sharp as a whole, thicknesses of lines are not uniform.

Figure 8C:
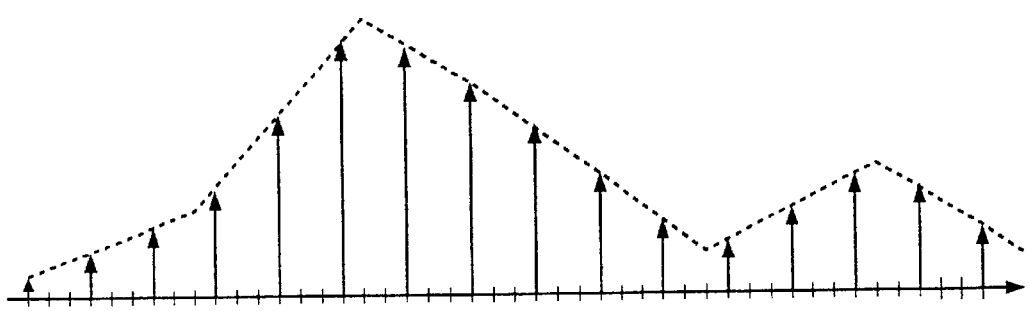

FIG. 8C shows an example in which the original image is enlarged and interpolated to 8/3 times by the bilinear approximating method. When the original signal is enlarged and interpolated to 8/3 times, the sampling period is set to (3/8)T. In this instance, according to the bilinear approximating method, since data between the sampling data is coupled by the linear interpolation, although unevenness of the thicknesses of lines is inconspicuous, the image of the original signal is widened and a picture plane is seen as if it blurred.

Figure 8D:
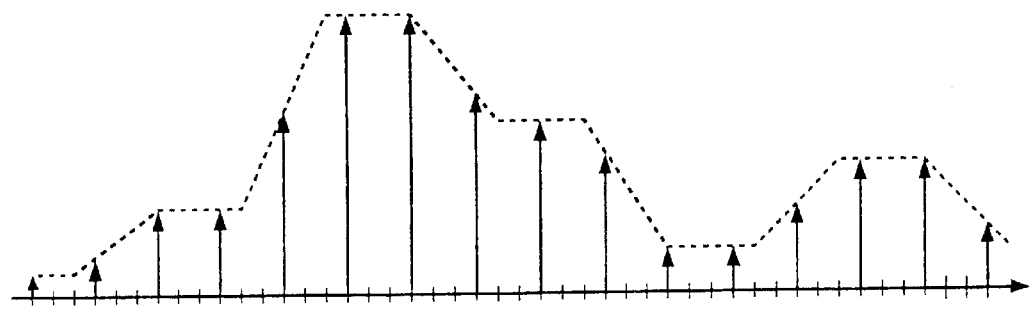

FIG. 8D shows an example in which the original signal is enlarged and interpolated to 8/3 times while assuming that the coefficient adjustment data α is set to (α=0.25). When the original signal is enlarged and interpolated to 8/3 times, the sampling period is set to (3/8)T. When the coefficient adjustment data α is set to (α=0.25), the intermediate characteristics between the nearest neighborhood approximating method and the bilinear approximating method are obtained. The sampling data between the original signals is continuously coupled is although a boundary of a certain extent is left. Thus, an excellent interpolation image can be observed.

According to the embodiment of the invention as mentioned above, since the filter coefficients so as to obtain the intermediate characteristics between the nearest neighborhood approximating method and the bilinear approximating method can be generated by the coefficient adjustment data α, an excellent interpolation image can be observed.

In the above example, the filter coefficients so as to obtain the intermediate characteristics between the nearest neighborhood approximating method and the bilinear approximating method can be generated by the coefficient adjustment data α by synthesizing the characteristics of the nearest neighborhood approximating method and the bilinear approximating method at an arbitrary ratio. However, the characteristics of the nearest neighborhood approximating method, the characteristics of the bilinear approximating method, and the intermediate characteristics between the nearest neighborhood approximating method and the bilinear approximating method can be switched on the basis of adjustment data from the user.

In the above example, although the interpolation arithmetic operating circuit has been realized by the delay circuits 2 and 3, multiplying circuits 4 and 5, coefficient generating circuit 6, and adding circuit 9 in a hardware manner, an interpolation arithmetic operating apparatus for performing an operation similar to that mentioned above can be realized by using a DSP (Digital Signal Processor) in a software manner.

According to the invention, either the nearest neighborhood approximating method or the bilinear approximating method can be selected by the coefficient adjustment data α, and any of the intermediate characteristics between the nearest neighborhood approximating method and the bilinear approximating method, characteristics which are closer to those of the nearest neighborhood approximating method between the nearest neighborhood approximating method and the bilinear approximating method, and characteristics which are closer to those of the bilinear approximating method between the nearest neighborhood approximating method and the bilinear approximating method can be freely set.

The present invention is not limited to the foregoing embodiment but many modifications and variations are possible within the spirit and scope of the appended claims of the invention.

What is claimed is:

1. An interpolation arithmetic operating apparatus for performing an interpolation by a convolution arithmetic operation by multiplying outputs of first and second taps by first and second filter coefficients, comprising:

cascade connected first and second delay means for extracting the outputs of said first and second taps;

coefficient generating means for generating said first and second filter coefficients in accordance with phase information and coefficient adjustment data, first and second multiplying means for multiplying the outputs of said first and second taps by said first and second filter coefficients respectively the output of said first and second taps are outputted from between the stages of said first and second delay means by said first and second filter coefficients, respectively;

adding means for adding outputs of said first and second multiplying means; and wherein an interpolation arithmetic operation output is obtained from said adding means; and wherein said first and second filter coefficient generating means can generate filter coefficients of characteristics of a nearest neighborhood approximating method to perform an interpolation by replacing nearest neighboring pixel data and filter coefficients of characteristics of a bilinear approximating method to obtain interpolation data by using a weighted mean of neighboring pixels and can generate filter coefficients of intermediate characteristics between said nearest neighborhood approximating method and said bilinear approximating method, and a ratio of the characteristics of said nearest neighborhood approximating method and a ratio of the characteristics of said bilinear approximating method can be set in accordance with said coefficient adjustment data.

2. An apparatus according to claim 1, wherein when said coefficient generating means obtains said first filter coefficient h1(p), it subsequently obtains said second filter coefficient h2(p) by an arithmetic operation of $$h2(p)=1-h1(p).$$

3. An interpolation arithmetic operating method of performing an interpolation arithmetic operation by a convolution arithmetic operation by multiplying outputs of first and second taps by first and second filter coefficients, comprising the steps of:

extracting outputs of said first and second taps;

generating said first and second filter coefficients in accordance with phase information and coefficient adjustment data;

multiplying the outputs of said first and second taps by said first and second filter coefficients, respectively;

adding multiplication output results of said first and second tap outputs; and obtaining an interpolation arithmetic operation output from said adding step;

wherein as said first and second filter coefficients, filter coefficients of characteristics of a nearest neighborhood approximating method to perform an interpolation by replacing nearest neighboring pixel data and filter coefficients of characteristics of a bilinear approximating method to obtain interpolation data by using a weighted mean of neighboring pixels can be generated, filter coefficients of intermediate characteristics between said nearest neighborhood approximating method and said bilinear approximating method can be generated, and a ratio of the characteristics of said nearest neighborhood approximating method and a ratio of the characteristics of said bilinear approximating method can be set in accordance with said coefficient adjustment data.

4. A method according to claim 3, wherein when said first filter coefficient h1(p) is obtained, said second filter coefficient h2(p) is obtained by an arithmetic operation of $$h2(p)=1-h1(p).$$

5. An interpolation arithmetic operating apparatus for performing an interpolation by a convolution arithmetic operation by multiplying outputs of first and second taps by first and second filter coefficients, comprising:

cascade connected first and second delay means for extracting the outputs of said first and second taps;

coefficient generating means for generating said first and second filter coefficients in accordance with phase information and coefficient adjustment data, first and second multiplying means for multiplying the outputs of said first and second taps by said first filter coefficient respectively the output of the first and second taps are outputted from between the stages of said first and second delay means by said first and second filter coefficients, respectively;

adding means for adding outputs of said first and second multiplying means; and wherein an interpolation arithmetic operation output is obtained from said adding means, and, wherein said first and second filter coefficient generating means can generate filter coefficients of characteristics of a nearest neighborhood approximating method to perform an interpolation by replacing nearest neighboring pixel data and filter coefficients of characteristics of a bilinear approximating method to obtain interpolation data by using a weighted mean of neighboring pixels and can generate filter coefficients of intermediate characteristics between said nearest neighborhood approximating method and said bilinear approximating method, and a ratio of the characteristics of said nearest neighborhood approximating method and a ratio of the characteristics of said bilinear approximating method can be set in accordance with said coefficient adjustment data.

* * * * *